United States Patent [19]

Goldberg

[11] Patent Number: 5,500,106

[45] Date of Patent: Mar. 19, 1996

[54] ELECTROPLATING PROCESS

[75] Inventor: Robert L. Goldberg, Sharon, Mass.

[73] Assignee: Shipley Company, L.L.C., Marlborough, Mass.

[21] Appl. No.: 489,613

[22] Filed: Jun. 12, 1995

Related U.S. Application Data

[63] Continuation-in-part of Ser. No. 206,733, Mar. 4, 1994.

[51] Int. Cl.$^6$ .......................................... C25D 5/54
[52] U.S. Cl. ........................ 205/166; 205/163; 205/183; 252/502; 252/510
[58] Field of Search .................................. 205/166, 163, 205/183; 252/502, 510

[56] References Cited

U.S. PATENT DOCUMENTS

| | | | |
|---|---|---|---|
| 4,619,741 | 10/1986 | Minten et al. ............................ | 204/15 |
| 4,895,739 | 1/1990 | Bladon ..................................... | 204/15 |
| 4,897,164 | 1/1990 | Piano et al. ............................. | 205/125 |
| 4,919,768 | 4/1990 | Bladon ..................................... | 204/15 |
| 4,952,286 | 8/1990 | Bladon et al. ........................... | 204/15 |
| 5,262,041 | 11/1993 | Gulla ...................................... | 205/125 |
| 5,269,973 | 12/1993 | Takahashi et al. ...................... | 252/521 |
| 5,276,290 | 1/1994 | Bladon ..................................... | 174/262 |
| 5,421,898 | 6/1995 | Stamp et al. ............................ | 205/166 |

Primary Examiner—John Niebling
Assistant Examiner—Kishor Mayrkar
Attorney, Agent, or Firm—Robert L. Goldberg

[57] ABSTRACT

A process for electroplating a substrate by coating the substrate with a porous coating of conductive particles having a reducing agent within its pores and electroplating over said coating. The reducing agent causes formation of an initial electroless metal deposit over the conductive particle coating thus enhancing its conductivity. The process is especially useful for the fabrication of printed circuit boards.

18 Claims, No Drawings

ELECTROPLATING PROCESS

CROSS REFERENCE TO RELATED APPLICATIONS

This application is a continuation in part of co-pending U.S. patent application Ser. No. 08/206,733 filed Mar. 4, 1994.

BACKGROUND OF THE INVENTION

I. Introduction

This invention relates to electroplating nonconductors, and more particularly, to a process for electroplating the surface of a nonconductor using a conductive particulate coating containing a reducing agent as a base for direct electroplating. This invention is especially useful for the manufacture of printed circuit boards.

II. Description of the Prior Art

Nonconductor surfaces are conventionally metallized by a sequence of steps comprising catalysis of the surface of the nonconductor to render the same catalytic to electroless metal deposition followed by contact of the catalyzed surface with an electroless plating solution that deposits metal over the catalyzed surface in the absence of an external source of electricity. Metal plating continues for a time sufficient to form a metal deposit of the desired thickness. Following electroless metal deposition, the electroless metal deposit is optionally enhanced by electrodeposition of metal over the electroless metal coating to a desired thickness. Electrolytic deposition is possible because the electroless metal deposit serves as a conductive coating that permits electroplating.

Catalyst compositions useful for electroless metal plating are known in the art and disclosed in numerous publications including U.S. Pat. No. 3,011,920, incorporated herein by reference. The catalyst of this patent consists of an aqueous suspension of a tin—noble catalytic metal colloid. Surfaces treated with such catalysts promote the generation of electrolessly formed metal deposits by the oxidation of a reducing agent in an electroless plating solution catalyzed by the catalytic colloid.

Electroless plating solutions are aqueous solutions containing both a dissolved metal and a reducing agent in solution. The presence of the dissolved metal and reducing agent together in solution results in plate out of the metal in contact with a catalytic metal tin catalyst. However, the presence of the dissolved metal and reducing agent together in solution may also result in solution instability and indiscriminate deposition of metal on the walls of containers for such plating solutions. This may necessitate interruption of the plating operation, removal of the plating solution from the tank and cleaning of tank walls and bottoms by means of an etching operation. Indiscriminate deposition may be avoided by careful control of the plating solution during use and by use of stabilizers in solution which inhibit indiscriminate deposition, but which also retard plating rate.

Attempts have been made in the past to avoid the use of art electroless plating solution by a direct plating process whereby a metal may be deposited directly over a treated nonconductive surface. One such process is disclosed in U.S. Pat. No. 3,099,608, incorporated herein by reference. The process disclosed in this patent involves treatment of the nonconductive surface with a tin-palladium colloid which forms an essentially nonconductive film of colloidal palladium particles over the nonconductive surface. This is the same tin-palladium colloid used as a plating catalyst for electroless metal deposition. For reasons not fully understood, it is possible to electroplate directly over the catalyzed surface of the nonconductor from an electroplating solution though deposition occurs by propagation and growth from a conductive surface. Therefore, deposition begins at the interface of a conductive surface and the catalyzed nonconductive surface. The deposit grows epitaxially along the catalyzed surface from this interface. For this reason, metal deposition onto the substrate using this process is slow. Moreover, deposit thickness is uneven with the thickest deposit occurring at the interface with the conductive surface and the thinnest deposit occurring at a point most remote from the interface.

An improvement in the process of U.S. Pat. No. 3,099,608 is described in U.K Pat. No. 2,123,036 B, incorporated herein by reference. In accordance with the process described in this patent, following catalysis, a surface is electroplated from an electroplating solution containing an additive that is said to inhibit deposition of metal on the metal surface formed by plating without inhibiting deposition on the metallic sites over the nonconductive surface. In this way, there is said to be preferential deposition over the metallic sites with a concomitant increase in the overall plating rate. In accordance with the patent, the metallic sites are preferably formed in the same manner as in the aforesaid U.S. Pat. No. 3,099,608—i.e., by immersion of the nonconductive surface in a solution of a tin-palladium colloid. The additive in the electroplating solution responsible for inhibiting deposition is described as one selected from a group of dyes, surfactants, chelating agents, brighteners, and leveling agents. Many of such materials are conventional additives for electroplating solutions.

There are limitations to the above process. Both the processes of the U.S. and U.K. patents for electroplating require conductive surfaces for initiation and propagation of the electroplated metal deposit. For this reason, the processes are limited in their application to metal plating solutions of nonconductive substrates in areas in close proximity to a conductive surface. In addition, in practice, it has been found that the surface provided with metallic sites is not robust and does not stand up to those chemical treatment compositions used prior to the step of electroplating. For this reason, when the process is used for the manufacture of printed circuit boards, void formation is a significant problem resulting in rejection of circuit boards manufactured by the process.

Improvements in processes for direct electroplating of nonconductors that overcome the deficiencies in the processes of U.S. Pat. No. 3,099,608 and in U.K. Pat. No. 2,123,036 are disclosed in U.S. Pat. Nos. 4,895,739; 4,919,768; 4,952,286; and 5,276,290, all incorporated herein by reference. In accordance with the processes of these patents, an electroless plating catalyst, such as that disclosed in the aforesaid U.K. patent, is treated with an aqueous solution of a chalcogen, such as a sulfur solution, to convert the catalyst surface to a chalcogenide surface. By conversion of the surface to the chalcogenide conversion coating, the coating formed is both more robust and more conductive and electroless plating catalyst does not desorb from the surface during metallization. Consequently, in accordance with the process of said patents, it is possible to form printed circuit boards using formulations that would otherwise attack the catalyst layer such as those solutions used in patterned plating processes.

The processes of the aforementioned patents provide a substantial improvement over the process of the U.K. Patent.

However, it has also been found that treatment of an absorbed catalytic metal on a substrate having both nonconductive portions and metallic portions, such as a printed circuit board substrate, with a sulfide solution results in a formation of a sulfide on metal surfaces in contact with the solution of the sulfide precursor solution. Therefore, if the process is used in the manufacture of printed circuit boards, both the catalytic metal and the copper cladding or conductors of the printed circuit board base material are converted to a tenaciously adherent sulfide. If the copper sulfide is not removed prior to electroplating, it may reduce the bond strength between the copper and a subsequently deposited metal over the copper.

An alternative method for direct electroplating of nonconductors is disclosed in U.S. Pat. No. 4,619,741, incorporated herein by reference. In accordance with the procedures of this patent, a nonconductive substrate is coated with a dispersion of carbon black and then dried. The coating is removed from surfaces where plating is undesired and the remaining portions of the substrate are plated using procedures similar to those described in the aforesaid references. There are several problems inherent in this procedure. For example, carbon black is a poor conductor of electricity, and consequently, before forming the carbon black dispersion, in practice, it is believed that the carbon black particles must be treated with an organic ionomer or polymer to enhance conductivity. In addition, during processing, and prior to electroplating, the carbon black dispersion is only poorly adhered to the underlying substrate and has a tendency to flake off of the substrate prior to the plating step. This results in void formation during plating. In addition, because of the poor adherence to the substrate, subsequent to plating, there is a tendency for the metal deposit to separate from the substrate. This can lead to interconnect defects between a metallized hole and an innerlayer in multilayer printed circuit fabrication.

A more recently utilized direct plate process for metallizing the walls of hole-walls employs dispersions of graphite for the formation of a conductive coating. The use of graphite to form conductive coatings on through-hole walls is known and disclosed in U.S. Pat. No. 2,897,409 incorporated herein by reference. Current processes are disclosed, for example, in U.S. Pat. Nos. 4,619,741 and 5,389,270, each incorporated herein by reference. In accordance with the procedures set forth in these patents, a dispersion of carbon black or graphite is passed through the through-holes to form a coating of the dispersion on the hole-walls. The coating is dried to yield a conductive layer of the carbon black or graphite which is sufficiently conductive for electroplating in a conventional manner.

In both the carbon and graphite processes, because of the poor conductivity of these materials relative to a metal, there is a tendency for the metal deposit to propagate from a conductive surface such as copper cladding in the fabrication of printed circuit boards. Therefore, the thickness of a deposit is uneven, thicker in the areas in closest proximity to the metallic layer and thinnest in the area most remote from the metallic surface. In addition, take-off time for initiation of deposition can be relatively slow, again as a consequence of the relatively poor conductivity of the carbonaceous coating.

In co-pending U.S. patent application Ser. No. 08/206,733 filed Mar. 4, 1994, incorporated herein by reference, an alternative to the use of carbon and graphite dispersions is disclosed. In accordance with the procedure described in this application, a dispersion of other conductive particles is used such as particles of metal, conductive metal salts and conductive oxides. As further disclosure within said application, additional components are added to the dispersion such as conductive polymers, binders, surfactants and reducing agents.

SUMMARY OF THE INVENTION

The process of the invention is directed to electroplating a substrate, especially a substrate having a surface comprising conductive (metallic) regions and nonconductive regions, such as a copper clad circuit board substrate. The process of the invention comprises providing a coating of conductive particles containing a reducing agent within the coating and electroplating the substrate using conventional electroplating procedures. The reducing agent within the coating is one capable of reducing metallic ions within the electroplating solution to metallic form. The reducing agent functions to initiate an electroless deposition reaction onto the coating when the coating to be plated is immersed in an electroplating solution containing reducible metallic ions, thus increasing the overall conductivity of the coating. This initial deposition of metal assists in initiating the electrolytic deposition reaction and provides a more coherent and uniform deposit as it overcomes the problems associated with the relatively poor conductivity of non-metallic conductive particles such as carbon black and graphite. The reducing agent may be a component of the dispersion or may be impregnated into the conductive coating following formation of the same.

In a preferred embodiment of the invention, the particles comprising the dispersion are conductive metal sulfides and carbon inclusive of graphite rather than unreacted metals. The reason for this is that metal particles dispersed in aqueous medium oxidize or hydrolyze resulting in a substantial reduction in conductivity, even in the presence of some reducing agents such as formaldehyde and hypophosphites capable of reducing metal ions to metallic form. Sulfides and carbon are known to be relatively conductive and are preferred because they will not hydrolyze or oxidize in aqueous medium. The dispersion used to form the conductive coating on the surface of a substrate may be any of the dispersion described above and may further contain a minor amount of a film-forming additive to improve adhesion of a dried coating of the dispersion to a substrate to be coated. Desirably, the film-forming additive is soluble in water but relatively insoluble in aqueous etchants for the metallic regions of the substrate for reasons to be disclosed in greater detail below.

DESCRIPTION OF THE PREFERRED EMBODIMENTS

The subject invention is suitable for the manufacture of a variety of commercial articles where a metal deposit is desired over a surface of a nonconductor. However, the invention is especially useful for fabrication of printed circuit boards. For this reason, the description that follows is directed primarily to printed circuit board manufacture.

In printed circuit board manufacture, the substrate commonly used is an epoxy substrate filled with glass fibers and copper clad on at least one of its surfaces, or an innerlayer clad with copper, as used for multilayer circuit fabrication. As is known in the art, the epoxy can be substituted or mixed with other resins for specific purposes.

In the manufacture of a double-sided printed circuit board, a first step comprises the formation of through-holes by drilling or punching or any other method known to the art.

Following formation of the holes, it is desirable to employ the conventional steps of rinsing with an organic solution to clean and degrease the board. This is followed by desmearing the hole walls with sulfuric acid, chromic acid, permanganate, or plasma etching. Following desmearing, the circuit board base material is conventionally treated with a glass etch that removes glass fibers extending into the holes from the hole walls. This is followed by a solution that neutralizes acid residues and then the hole walls are conditioned m promote catalyst adsorption. Such solutions are often referred to as conditioners and typically comprise an aqueous alkaline surfactant solution for cleaning soil and a quaternary amine to condition the hole wall. the hole wall. The material of choice for the step of conditioning is a polyelectrolyte. Polyelectrolytes are typically polymers having a plurality of charged groups along their chains where the charged groups carry a charge opposite from the charge of a dispersed particle to adsorbed onto the substrate. Polyelectrolytes used in metal plating procedures are disclosed in numerous publications including U.K. Patent No. 1,338,491 and U.S. Pat. Nos. 4,478,883; 4,554,182; 4,701, 350 and 4,969,979, each incorporated herein by reference. The step of treatment with the polyelectrolyte, by itself, is old in the art and does not constitute a part of the invention.

Following the pretreatment procedures described above, the next step in the process comprises coating the substrate with a dispersion of conductive particles. The conductive particles are selected from the group of metal particles, carbon particles inclusive of graphite and carbon black, and conductive metal salts where a film of the salt: would have a surface resistivity of less than $1 \times 10^{-2}$ and preferably a surface resistivity of less than $1 \times 10^{-3}$ ohm.cm. If a metal particle is used, though more costly, it is desirable that the metal be a noble metal as noble metals are more resistant to oxidation. Suitable noble metals include gold, palladium, indium and platinum. If cost is a consideration, non-noble metals may also be used, but if used, the reducing agent referenced above is desirably added to the dispersion and desirably is capable of both reducing the oxide to metal to minimize surface oxidation or hydrolysis and assisting in the deposition of metal during the step of electrolytic deposition of metal as has been described above and described below in greater detail. Suitable non-noble metal particles include the Group IB, VIIB and VIIIB metals such as copper, nickel, zinc, cobalt and manganese.

In the preferred embodiment of the invention as defined above, carbon particles and conductive metal salt particles are used rather than a metal. A preferred class of metal salts are sulfides because of their known conductivity. Conductive metal sulfides are disclosed in U.S. Pat. Nos. 5,268,024 and 5,269,973, incorporated herein by reference. Suitable sulfides are sulfides of bismuth, zinc, indium vanadium, antimony, manganese, lithium, titanium, molybdenum, germanium, tin, zirconium, magnesium, barium and cadmium. Most preferred are sulfides of nickel, copper and molybdenum because of their good conductivity and low cost. Another class of conductive particles in accordance with the invention are the superconducting materials such as the mixed oxides of yttrium, barium and copper; oxides of bismuth, strontium, copper; oxides of thallium, calcium, strontium and copper; and calcium, barium, lanthanum and copper. Carbon particles include carbon black and graphite as disclosed in U.S. Pat. Nos. 2,897,409; 4,619,741 and 5,389,270, each referenced above.

The particle size of the conductive particles is critical where the dispersion is to be used to coat the walls of through-holes in printed circuit board manufacture. Therefore, the particle size must be such that the dispersion of the particles will readily flow through the through-holes to coat the same without plugging the holes with the dispersion. In addition, following drying of the dispersion and electroplating of the dried coating, the total thickness of the dried coating and metal plate cannot fill the full diameter of the through-hole. For this reason, the particle size of the conductive particle is desirably low, preferably 5 microns or less, and more preferably, within the range of about 0.5 to 2.5 microns.

The conductive particles are dispersed in a liquid dispersant. Polar organic dispersants such as methanol, ethanol, various glycols and ether alcohols, are suitable. However, for ecological reasons, water is the preferred dispersant.

To promote a stable dispersion as required for shipment in commerce, and to induce wetting of hydrophobic surfaces in contact with the dispersion, the dispersion desirably contains a dispersing agent or surfactant. The use of dispersing agents or surfactants to stabilize particulate dispersions is well known in the art. One or more of these additives is added to the dispersion in accordance with the invention. The surfactant may be either an anionic, nonionic, or cationic surfactant or combinations thereof. It should be soluble, stable, and preferably non-foaming in the liquid medium. In general, for aqueous dispersions, the surfactant should preferably have a high HLB number (8–18). The preferred type of surfactant will depend mainly on the pH of the dispersion. If the total dispersion is alkaline (i.e., has an overall pH in the basic range), it is preferred to employ an anionic or nonionic surfactant. Acceptable anionic surfactants include sodium or potassium salts of naphthalene sulfonic acid such as DARVAN No. 1 (R. T. Vanderbilt Co.), ECCOWET LF (Eastern Color and Chemical), PETRO AA, PETRO ULF (Petro Chemical Co., Inc.) and AEROSOL TO (American Cyanamid). Preferred anionic surfactants include neutralized phosphate ester-type surfactants such as MAPHOS 55, 56, 8135, 60A, L6 (Mazer Chemicals Inc.). The most preferable anionic surfactant for a liquid carbon black dispersion is MAPHOS 56. Suitable nonionic surfactants include ethoxylated nonyl phenols such as POLY-TERGENT® B-Series (Olin Corporation) or alkoxylated linear alcohols such as POLY-TERGENT SL-Series (Olin Corporation).

If the total dispersion is acidic, it is preferred to employ selected anionic surfactants or cationic surfactants. An acceptable group of anionic surfactants would be the sodium or potassium salts of naphthalene sulfonic acid described above. Acceptable cationic surfactants include cetyl dimethyl benzyl ammonium chloride such as AMMONYX T (Onyx Chemical Corporation); an ethanolated alkylguanidine amine complex such as AEROSOL C-61 (American Cyanamid); lipocals; dodecyldiphenyl oxide disulfonic acid (DDODA) such as DOWFAX 2AI (Dow Chemical); a sodium salt of DDODA such as STRODEX (Dexter Chemical Corporation); and salts of complex organic phosphate esters. Preferred surfactants include amphoteric potassium salts of a complex amino acid based on fatty amines such as MAFO 13 and cationic ethoxylated soya amines such as MAZEEN S-5 or MAZTREAT (Mazer Chemicals Inc.).

A coating formed from the conductive particles is relatively porous as would be expected when a coating is formed from a dispersion of particulate. In accordance with the invention, a reducing agent is provided within the pores of the coating. The reducing agent may be incorporated into the coating by any one of a variety of methods. For example, the dispersion of the conductive particles may include a solution compatible reducing agent. Alternatively, the coating formed may be impregnated with a reducing agent by immersing the formed coating in a solution of a reducing agent. The solution may be a rinse water solution in which the reducing agent is dissolved used to rinse the coating immediately preceding immersion in the plating solution. Immersion should be for a time sufficient to fully impregnate the coating with the solution of the reducing agent. This time may vary from one to ten minutes and may be accelerated by immersion in solution under pressure. The substrate having the coating impregnated with the reducing agent may be directly immersed in the plating solution or may be rinsed prior to immersion into the plating solution.

The reducing agent serves several purposes. If the coating material is an oxygen sensitive material and the dispersion contains the reducing agent, the reducing agent reduces oxides within the coating. When the coating provided with the reducing agent is immersed into an electroplating solution, the reducing agent in the coating in contact with metallic ions from the plating solution will cause an initial electroless plate-out of metal onto the particulate coating that will increase the conductivity of the coating and thus enhance the electrolytic plating reaction. Enhancement will take the form of a shortened time to initiate deposition, a more uniform deposit, especially through the length of a through-hole, and will enable the use of higher amperage plating with a reduced risk of burn-out of the conductive coating material.

Suitable reducing agents are those reducing agents capable of reducing plating metal ions to metallic form. For copper deposition, formaldehyde, borohydrides and amine boranes such as dimethyl amine borane would be suitable. For other plating solutions, such as nickel plating solutions, the aforesaid reducing agents would be suitable as would weaker reducing agents such as hypophosphites such as sodium hypophosphite and hydroxylamine hydrochloride. The selection of the reducing agent is in part dependent upon the pH of the dispersant. Amine boranes are preferred for alkaline dispersions. As described above, the reducing agent may added directly to the dispersion or may be used as a separate solution following formation of the coating. As an additive to the dispersion, the reducing agent may comprise from 0.1 to 10.0 or more percent by weight of the total formulation and more preferably, is added in an amount of from 0.5 to 2.5 percent of the formulation. If used as an additive, in a separate solution such as a component of a rinse water, the upper limit of the concentration range may be increased to 20 percent or more.

An optional, but desired additive to the dispersion is a film-forming component. This component is used to maintain the integrity of a coating of the dispersion following drying of the same. The film-forming component is desirably one that is not washed away during treatment steps following drying of the dispersion and the step of electroplating. Using circuit board manufacture for purposes of illustration, one step in the process to be described in greater detail below comprises cleaning the copper with an acidic etchant prior to the step of electroplating. In this embodiment of the invention, the film former is desirably an acid insoluble material so that the etchant does not remove the coating of the dispersion from hole walls. The coating of the dispersion is removed from copper surfaces by penetration of the etchant through the coating and undercutting of the coating as copper is dissolved by the etchant resulting in lift-off of the coating.

The film-forming additive is used in the dispersion sparingly because too high a concentration can result in the film former encapsulating the particles and acting as an insulating layer between particles thereby preventing electrical conductivity. A loss of electrical conductivity may prevent complete coverage during the step of electroplating metal onto a dried coating formed from the dispersion. In addition, the film-forming additive, if acid insoluble, is used in a low concentration whereby it does not prevent penetration of the etchant through the coating during the etching step. However, this concentration can be larger than in the prior art due to the enhancement of conductivity arising from the use of the reducing agent in accordance with the invention. Consequently, the maximum concentration of the film-forming additive would be that amount just below that amount where particles would be encapsulated and below that amount where a film would be formed that would prevent penetration by the etchant.

Suitable film-forming additives should be obvious to those skilled in the art. A preferred class of film-forming additives useful in processes using acid etchants to etch copper are acid insoluble, alkali soluble polymers such as phenolic resins inclusive of novolak resins, polyvinyl phenols and styrene polymers. Other polymers include polyvinyl pyrrolidone, cellulose ethers, etc. Natural materials such as starch, gum arabic, rosin and gelatin are also suitable. A preferred class of naturally occurring film formers would be sugars, as sugars both form a film and act as a reducing agent. Another class of preferred film formers would be conductive polymers such as polymers formed from pyrrole, furane, thiophene or derivatives as disclosed in International Publication Number WO 89/08375, incorporated herein by reference. The use of a conductive polymer provides the advantage of a film former without degradation of the conductivity of the coating.

The concentration of the conductive particles in the dispersion should be relatively low but adequate for conductivity in a dried coating of the dispersion. Consequently, the concentration of the particles preferably varies from about 0.1 to 5% by weight and more preferably, from about 0.2 to 2% by weight. The concentration of the surfactant is that amount necessary to maintain the particles dispersed in solution. A suitable concentration for the surfactant varies between about 0.01 and 4%, and preferably, between 0.1 and 2%. With regard to the film-forming additive, taking into consideration the criticality of the concentration as described above, the concentration of the film former may vary from about 0 to 5% and preferably, from about 0.5 to 2%.

The dispersion of conductive particles is applied to a substrate in a conventional manner. Preferably, the substrate is immersed in the dispersion with agitation (back and forth oscillation) to ensure that the dispersion enters into and passes through the through-holes in the case of a printed circuit board substrate. The dispersion may be maintained at room temperature, and the period during which the substrate is immersed in the dispersion may range from about 30 seconds to 10 minutes, and preferably from about 2 to 5 minutes. The substrate is then removed from the dispersion and dried. Drying can be by evaporation at room temperature, with vacuum assistance, or by heating the board in an oven for a short time at an elevated temperature such as from 75° C. to 120° C. for a period of time ranging between 30 seconds and 45 minutes as required to evaporate the dispersant from the solids.

Following formation of the dried coating of the conductive particles, metallic surface regions are etched with an etcham. This is a conventional step used to remove surface contaminants from the metal surfaces such as grease and oxides. Though a conventional step, the step of etching is a significant step when the process of the invention is used for the manufacture of printed circuit boards as the etchant permeates the coating overlying the metal regions of the substrate and removes the coating over the metal regions by dissolving the underlying metal whereby the coating flakes off and enters the solution of the etchant. The coating must be removed from the metal regions prior to plating to ensure bonding of electroplated metal to the metal regions. Conventional etchants are suitable for this process such as, for example, a sulfuric acid-hydrogen peroxide pre-etch such as PREPOSIT® 746 etchant available from Shipley Company of Marlborough, Mass. The etchant may be used at room temperature for a period of time ranging between 1 and 10 minutes. The time should be sufficiem to remove the coating from the metal regions without damaging the coating and through-holes. The use of the etcham effectively removes soil and contaminants from the metal regions as well as the coating over the metal regions.

If the reducing agent is not contained in the dispersion, the next step in the process would be impregnation of the coating with the reducing agent. This step has been described above and may comprise immersion of the coating into a rinse water solution in which the reducing agent is dissolved.

The next step in the process comprises electroplating directly over the coating of conductive particles impregnated with the reducing agent without an intermediate step of electroless metal plating except as will take place as a consequence of contact of the reducing agent within the conductive coating with the metal ions of the electrolytic plating solution. The electroplating procedure is similar to the procedure disclosed in the above-referenced U.K. patent, but careful control of the electroplating parameters as required in the process of the U.K. patent is not necessary in the process of this invention. The electroplating process may use electroplating solutions such as those disclosed in the U.K. patent. The preferred electroplating metals in accordance with the invention are copper and nickel though the process is suitable for electroplating of any desired metal. A typical electroplating solution comprises an aqueous acid solution of the metal desired to be plated together with proprietary additives from the groups of dyes, surfactants, chelating agents, brighteners, leveling agents, etc. Typical acids used in the formulation of said baths comprise those with a high ionic dissociation constant for maximum conductivity such as sulfuric acid, fluoroboric acid, sulfamic acid, etc. Dyes typically used in such baths include methylene blue, methyl violet, and other N-heterocyclic compounds; triphenyl methane type dyes and aromatic amines, imines and diazo compounds. Suitable surfactants included in such baths typically include non-ionic surfactants such as alkylphenoxy polyethoxyethanols, e.g., octylphenoxy, polyethoxyethanol, etc. Surfactants include wetting agents and water soluble organic compounds such as compounds containing multiple oxyethylene groups have been found to be effective. A preferred group of said compounds include polyoxyethylene polymers having from as many as 20 to 150 repeating units. Also included in this class of materials are block copolymers of polyoxyethylene and polyoxypropylene. The additives described above are added to the solution in conventional concentrations.

The electroplating procedure is conventional. The part to be plated is used as a cathode in a conventional electroplating cell. Current density is conventional and varies typically within a range of from 10 through 40 amps/ft.$^2$. Theoretically, no current is required to initiate deposition due to the presence of the reducing agent in the coating. However, in practice, it is convenient to initiate the current as the part enters the plating solution. A preferred current density range is from 15 to 30 amps/ft.$^2$. The plating solution is maintained at a temperature ranging between room temperature and about 100° F. Plating is continued for a time sufficient to form a deposit of desired thickness. For circuit board manufacture, a desired thickness may range between 0.5 and 2.0 mils, typically from 1 to 1.5 mils. A plating time of from 15 to 90 minutes would typically be required to obtain a deposit of the preferred thickness within the preferred range of current densities. The deposit formed by the process is uniform in thickness, free of defects and strongly bonded to the surface of the nonconductor over which it is plated. Bond strength is satisfactory to withstand solder shock testing as conventionally used in printed circuit board manufacture.

EXAMPLE 1

A dispersion may be prepared by combining 15 grams of molybdenum disulfide having a mean particle size of 1 micron with 0.2 grams of the potassium salt of naphthalene sulfonic acid surfactant and 10 grams of formaldehdye with 1 liter of water. The mixture would be stirred for 6 hours using a magnetic bar stirrer at room temperature to form the dispersion.

EXAMPLE 2

One liter of a graphite treatment solution may be prepared by adding 200 grams of colloidal graphite dispersion identified as GRAFO 1204B (available from Metal Lubricants Company of Harvey, Ill.) to 790 grams of deionized water with stirring for 20 minutes. Six grams of potassium carbonate may be added to the mixture with stirring for about 15 minutes. The pH of the mixture may then be increased to about 11 and 1 gram of an acrylic emulsion may be added with stirring. The composition so prepared would be diluted to about 5% by weight graphite particles for use.

Twenty grams of dimethyl amine borane would be added to the dispersion prior to use to form a conductive coating.

EXAMPLE 3

The following example illustrates the manner in which a printed circuit board substrate may be electroplated in accordance with the procedures of this invention. All proprietary chemicals identified in the example are available from Shipley Company of Marlborough, Mass.

A multilayer circuit board having 4 circuit layers with an array of 14 and 36 mil. holes may be subjected to the following procedure.

Step 1 Pre-clean and condition:

a. immerse in a proprietary organic solvent identified as MLB 211 at 160° F. for 5 minutes and water rinse;

b. desmear the hole walls with a proprietary permanganate solution identified as MLB 213 Promoter at a temperature of 180° F. for 6 minutes and water rinse;

c. neutralize acid residues by treatment with a proprietary alkaline solution identified as Neutralizer 218-1 at room temperature for 3 minutes and water rinse;

d. condition the hole walls using a proprietary quaternary amine solution identified as XP-9420 at a temperature of 115° F. for 5 minutes and water rinse.

Step 2 Form conductive particle coating:

a. immerse the substrate in the dispersion of Example 2 for 5 minutes at room temperature while gently oscillating the board back and forth within the dispersion to ensure that the dispersion passes through the through-holes;

b. dry the coating on the substrate by placing the substrate in an air circulating oven maintained at 75° C. for 30 minutes.

Step 3 Microetch copper surfaces and remove dispersion coating from copper cladding.

Immerse the board in a proprietary peroxide sulfuric acid microetch identified as XP-9425 at 95° F. for 1 minute and water rinse. Inspection of the copper cladding will reveal that the dispersion coating has been removed from the surface leaving a clean copper surface available for metal plating.

Step 4 Electroplate:

Electroplate copper from an acid copper electroplating bath identified as ELECTROPOSIT® 1100 acid copper at a current density of 20 amps./ft.$^2$ and at a temperature of 70° F. for 1 hour and water rinse to obtain a deposit having a thickness of about 1.5 mils.

EXAMPLE 4

Repeat the procedure of Example 3 without addition of the amine borane to the graphite dispersion. Form the coating of the graphite dispersion and following the step of microetching, immerse the substrate in rinse water to which is added 1 percent solution of dimethyl amine borane.

EXAMPLE 5

Repeat the procedure of Example 1 substituting a mixed oxide of yttrium, barium and copper particles for the molybdenum disulfide in an amount of 10 g/l.

EXAMPLE 6

Repeat the procedure of Example 1 adding 5 grams of a novolak resin to the dispersion.

EXAMPLE 7

Repeat the procedure of Example 1 adding 2 grams of hydroxylamine hydrochloride to the dispersion.

I claim:

1. A process for plating a nonconducting substrate with a metal, said process comprising the steps of providing a porous coating of carbon particles on said substrate, providing a reducing agent within the pores of the porous coating of said carbon particles, said reducing agent being of a strength sufficient to reduce ions of metal to be plated onto the substrate when in contact with the same, contacting said substrate having said porous coating containing the reducing agent within the coating with an electrolytic metal plating solution to form an initial coating of the metal on the conductive coating by reduction and electroplating the metal over the contacted substrate.

2. The process of claim 1 where the carbon particles are in the form of carbon black.

3. The process of claim 1 where the carbon particles are in the form of graphite.

4. The process of claim 1 where the metal to be plated onto the substrate is copper.

5. The process of claim 4 where the reducing agent is selected from the group of amine boranes, borohydrides and formaldehyde.

6. The process of claim 1 where the reducing agent is provided in the coating by incorporating the reducing agent into an aqueous dispersion of the carbon particles and coating the dispersion onto the substrate to form the porous coating of the carbon particles.

7. The process of claim 1 where the reducing agent is provided in the coating by rinsing the porous coating after it is formed and prior to contact with the metal plating solution with an aqueous solution of the reducing agent for a time sufficient for the reducing agent to infiltrate the coating.

8. The process of claim 7 where the reducing agent is contained in a rinse water.

9. The process of claim 6 where said dispersion is an aqueous dispersion containing as an additional component a member selected from the group consisting of a film-forming additive, a surfactant, a conductive polymer and mixtures thereof.

10. The process of claim 9 where said dispersion is an aqueous dispersion containing a conductive polymer.

11. The process of claim 9 where said dispersion is an aqueous dispersion containing a film-forming additive.

12. A dispersion for forming a conductive coating on a nonconducting substrate suitable for electroplating with a metal, said dispersion comprising an aqueous liquid dispersion containing carbon particles in an amount up to 5 percent by weight sufficient to form the conductive coating, and a reducing agent in an amount up to 10 percent by weight of a strength sufficient to reduce cupric ion to metallic copper.

13. The dispersion of claim 12 where the concentration of the reducing agent varies between about 0.1 and 10 percent by weight.

14. The dispersion of claim 12 where the concentration of the reducing agent varies between about 0.25 and 5 percent by weight.

15. The dispersion of claim 12 where the reducing agent is selected from the group consisting of formaldehyde, a borohydride and an amine borane.

16. The dispersion of claim 12 where the carbon particles have a mean particle size not exceeding 5 microns and are contained in the dispersion in an amount of from 0.1 to 5 percent by weight of the dispersion.

17. The dispersion of claim 13 where the carbon particles are in the form of carbon black.

18. The dispersion of claim 13 where the carbon particles are in the form of graphite.

\* \* \* \* \*